(12) United States Patent
Roosli et al.

(10) Patent No.: US 10,288,651 B2
(45) Date of Patent: May 14, 2019

(54) SYSTEM FOR MEASURING ENERGY CONSERVATION EFFECTIVENESS

(71) Applicant: Honeywell International Inc., Morristown, NJ (US)

(72) Inventors: Philipp A. Roosli, Niantic, CT (US); Michael Asmussen, New London, CT (US); Michael D. Sobanko, Oakdale, CT (US)

(73) Assignee: Honeywell International Inc., Morris Plains, NJ (US)

( * ) Notice: Subject to any disclaimer, the term of this patent is extended or adjusted under 35 U.S.C. 154(b) by 433 days.

(21) Appl. No.: 14/228,014

(22) Filed: Mar. 27, 2014

(65) Prior Publication Data

US 2015/0276826 A1 Oct. 1, 2015

(51) Int. Cl.
| | | |
|---|---|---|
| *G01D 4/00* | (2006.01) | |
| *H02J 3/14* | (2006.01) | |
| *G01R 21/00* | (2006.01) | |
| *G06Q 50/06* | (2012.01) | |

(52) U.S. Cl.
CPC ............ *G01R 21/00* (2013.01); *G06Q 50/06* (2013.01); *H02J 3/14* (2013.01); *G01D 4/002* (2013.01); *G05B 2219/2642* (2013.01); *Y02B 70/3225* (2013.01); *Y02B 70/3241* (2013.01); *Y02B 90/241* (2013.01); *Y04S 20/222* (2013.01); *Y04S 20/227* (2013.01); *Y04S 20/32* (2013.01)

(58) Field of Classification Search
CPC ......... G06Q 50/16; G06Q 50/06; G01R 21/00
See application file for complete search history.

(56) References Cited

U.S. PATENT DOCUMENTS

| | | | |
|---|---|---|---|
| 7,643,908 B2 | 1/2010 | Quirino et al. | |
| 8,127,154 B2* | 2/2012 | Elnozahy | G06F 9/3863 |
| | | | 705/412 |
| 2008/0125873 A1* | 5/2008 | Payne | H04L 12/2803 |
| | | | 700/2 |
| 2009/0065598 A1* | 3/2009 | Quirino | F24F 11/30 |
| | | | 236/51 |
| 2011/0072412 A1* | 3/2011 | Hasslen | G06F 17/5022 |
| | | | 717/106 |
| 2013/0144546 A1 | 6/2013 | Brackney et al. | |
| 2013/0151212 A1 | 6/2013 | Gray et al. | |
| 2013/0173188 A1* | 7/2013 | Kayton | G01R 21/00 |
| | | | 702/60 |
| 2013/0345998 A1* | 12/2013 | Matsubara | G01R 21/00 |
| | | | 702/60 |

(Continued)

FOREIGN PATENT DOCUMENTS

AU    721496    7/2000

*Primary Examiner* — Alexander Satanovsky
*Assistant Examiner* — Brent A. Fairbanks
(74) *Attorney, Agent, or Firm* — Seager, Tufte & Wickhem LLP

(57) ABSTRACT

An observed space having energy consuming devices with conservation mechanisms, algorithms, techniques, or applications. The devices having their conservation applications engaged may be a normal mode. When the conservation applications are disengaged, the devices may be in a reference mode. An amount of energy consumption by the devices in the normal mode may be compared with an amount of energy consumption by the devices in the reference mode to determine an energy conservation effectiveness of the devices in the observed space.

17 Claims, 4 Drawing Sheets

(56) References Cited

U.S. PATENT DOCUMENTS

2014/0053003 A1* 2/2014 Moyer .................. G06F 21/558
  713/300
2014/0277796 A1* 9/2014 Peskin ................... G05B 13/04
  700/291

* cited by examiner $$\text{SAVINGS PERCENTAGE} = 100\% * (1-((kW_{ref} * t_{EMS})/(kW_{EMS} * t_{ref})))$$

FIGURE 3

$$\text{Savings \% for device } n = 100\% * \left(1 - \frac{\sum_{room=1}^{x} kW_{EMS}\,device\,n * \sum_{room=1}^{x} t_{EMS}\,device\,n}{\sum_{room=1}^{x} kW_{ref}\,device\,n * \sum_{room=1}^{x} t_{ref}\,device\,n}\right)$$

SYSTEM FOR MEASURING ENERGY CONSERVATION EFFECTIVENESS

BACKGROUND

The present disclosure pertains to energy consumption and savings. Particularly, the disclosure pertains to measuring parameters related to potential energy savings.

SUMMARY

The disclosure reveals an observed space having energy consuming devices with conservation mechanisms, algorithms, techniques, or applications. The devices having their conservation applications engaged may be a normal mode. When the conservation applications are disengaged, the devices may be in a reference mode. An amount of energy consumption by the devices in the normal mode may be compared with an amount of energy consumption by the devices in the reference mode to determine an energy conservation effectiveness of the devices in the observed space.

BRIEF DESCRIPTION OF THE DRAWING

FIG. 3 is a diagram of a formula that may be used to determine a percent of savings in energy consumption by a system of elements due to energy conservation techniques, mechanisms, applications and/or algorithms; and FIG. 4 is a diagram of a formula that may be used to determine a percent of savings in energy consumption by an element of a system in a room or space of a multi-space facility.

DESCRIPTION

Figure 1:
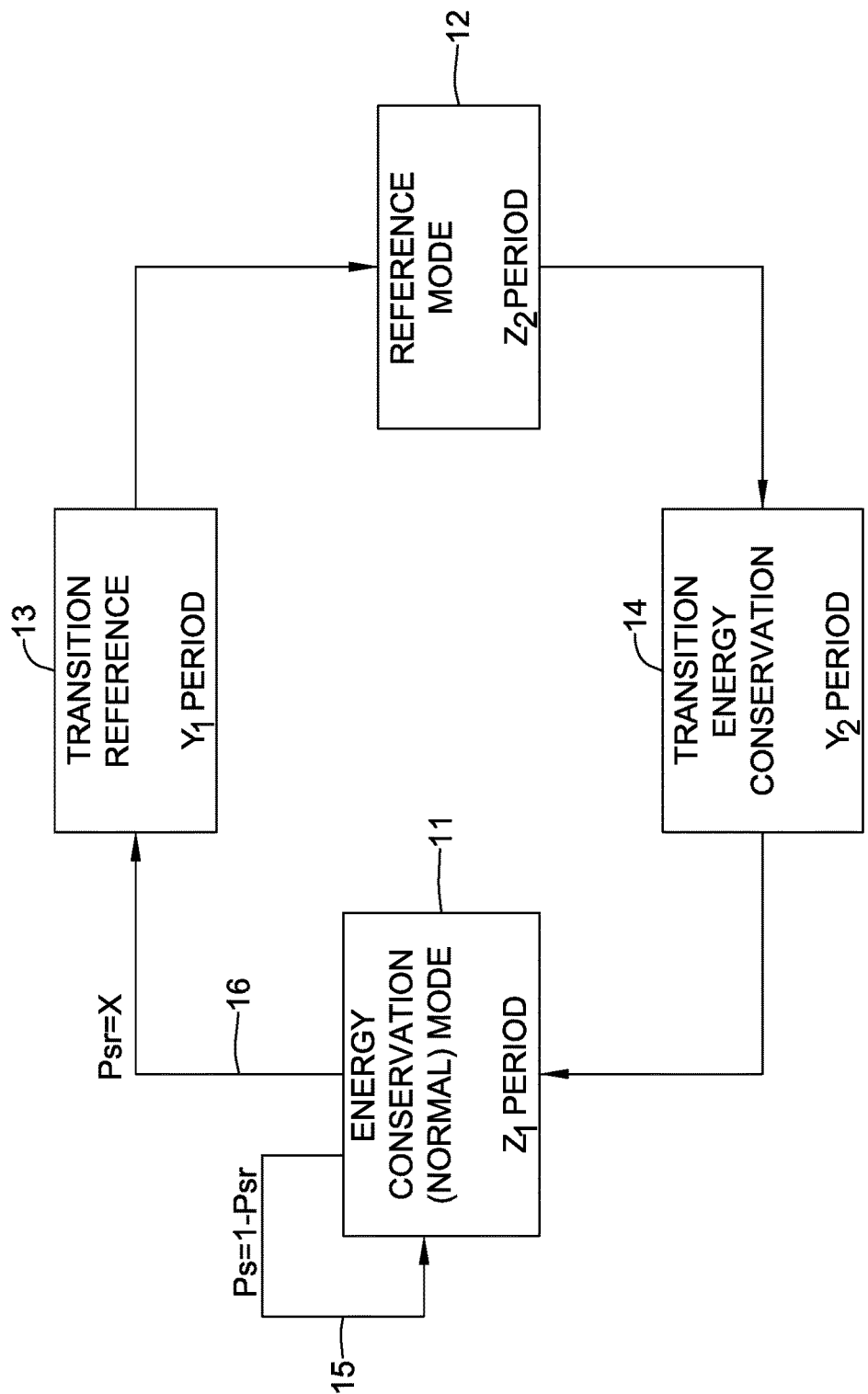
FIG. 1 is a diagram of the present system for measuring energy conservation effectiveness.

The present system and approach may incorporate one or more processors, computers, controllers, user interfaces, wireless and/or wire connections, and/or the like, in an implementation described and/or shown herein.

This description may provide one or more illustrative and specific examples or ways of implementing the present system and approach. There may be numerous other examples or ways of implementing the system and approach.

In building automation systems, energy may be conserved by, for example, reducing heating and cooling efforts if the space that is being controlled has no or few occupants. Similarly, an illumination of the space may be controlled more efficiently if the system takes in account the location and number of building occupants.

Establishing how much energy is being conserved by these measures may be a complex task as one tries to document a difference between something that happened or took place (namely, the energy consumed with the energy conservation measures or efforts engaged, in place or active), and something that did not happen or take place (namely, the energy that would have been consumed if the energy conservation measures or efforts would not have been engaged, in place or active).

Approaches in the conservation measures field may be improved. For example, one may turn-off all energy conservation features in a building for a long time and then compare the total energy intake of the building against a period where the conservation algorithms have been active. This approach may suffer in that the weather and building usage patterns are not constant and a computational compensation of these external effects may introduce compounding inaccuracies that are grave as savings are computed as differences between large numbers, i.e., a small inaccuracy in compensating these numbers may lead to large variations in the differences.

In these types of efforts, there may be a bias towards keeping the reference modes where the energy conservation features are turned off to a shortest possible or limited scope as possible. This may be due to the fact that turning off energy conservation measures to show the effectiveness of the program can go against the overall goal to maximize the energy conservation results. The effectiveness of energy conservation approaches may be based on an amount of data and interpolation.

The energy conservation tests may be organized by humans in that an allocation of the test groups is engineered and not truly random. Human organizing efforts may create an additional bias towards possible errors.

An approach that comprehensively demonstrates the energy conservation effectiveness of control solutions without the limitations indicated herein may have a competitive advantage.

To overcome a bias towards what systems are selected to participate in energy conservation tests and when they operate in either an energy conserving or a reference mode, one may use a randomization process where control units by themselves determine when the systems run in either mode. For an example in a hotel, each guestroom control may randomly turn off its energy conservation for a certain period of for example six 24-hour periods over the duration of a year. In a 100 room hotel, this may create 600 days of unbiased reference data where the weather, rented status, occupant usage patterns and any other external influence would be neutralized due to the large number of data samples. The same building may provide $(365-6) \times 100 = 35900$ days of data that describe the energy consumption when the energy conservation measures have been in place. In this example, one may sacrifice about two percent of the energy savings potential for the purpose of establishing how much energy is conserved.

Such system may have some limitations as addressed in the following. First, metering a large selection of building elements may be much more expensive than if only a small fraction of the building is metered. This issue may be solved by tasking each controller to track and report the run-time of controlled equipment. For example, if a 120 Watt fan motor is operated for 3 hours during an observation interval, one may report $3 \times 120 = 0.360$ kWh of energy consumption.

Second, transitioning from an energy conserving to a non-energy conserving mode may create a bias that would normally overstate the energy conservation effectiveness. For example, the initial period of an energy conservation effort may benefit from the latent heat that is present from a previous non-conserving mode. Likewise, transitioning from a conservation mode (normal) back to a non-conservation mode (reference) may require a recovery of the latent heat that was saved. To address this limitation, one may add a transitioning period between the normal and reference modes for which the data is not taken into account when establishing the energy conservation effectiveness. A duration of the transition period may have to be reflective of the process that is being controlled. For example, in a heating/ cooling application, this transitioning period may be typically between 6 and 24 hours.

A feature of the present approach may be that the application should not necessarily be limited to a single domain, such as energy conservation by a room heat control thermostat, but rather encompass virtually all loads that have energy conservation measures that pertain to a larger scope, such as a hotel guestroom, a private residence, or a multi-space facility. A key may be that virtually all elements that control energy need to be synchronized when going into a reference mode or when to returning to a normal mode, and vice versa, respectively. For example, energy conservation measures by an automated drapery application, an automated light control application, radiant floor heat in bathrooms or towel heaters, and so on, may need to be in the same mode, that is, the reference mode or the normal mode, at the same time. This may be important because if the heating controlled by the thermostat would be curtailed, and if the radiant bathroom floor heat or the drapery application would not be acting in concert with these efforts, then often energy consumption would be shifted from one element to another, thereby not clearly showing the effectiveness of an overall (holistic) application of energy conservation.

In summary, the present approach may incorporate a synchronized operation of reference and normal modes by at least two energy consuming domains such as draperies, floor heat, and so on, of a given space or area.

A configurable random generator may be used where a duration of a reference mode, time of transition periods and likelihood (rate) of reference modes can be operated. The present or reference mode may be communicated to virtually all control elements of an observed space/area (e.g., a hotel guestroom, residence/house, or an office floor). One may track run-time or meter energy consumption of all controlled loads and report accumulated runtime or energy for each mode to a server for aggregation. During the reference mode, the loads may be as if operated only in a manual fashion. In the normal mode, virtually all energy conserving algorithms or mechanisms may be engaged.

Accumulated data may be processed with statistical approaches, such as determining means and standard deviations of data generated for each reference and normal mode. Confidence intervals may be applied to the collected data to assure that sufficient data is collected to allow a building of a reliable difference between the two groups (i.e., loads of two modes) to demonstrate the effectiveness of the energy conservation algorithms.

In the reference (manual) mode, examples may be such that the thermostat does not setback the target temperature bands, lights do not go off as a space becomes unoccupied, draperies do not close to avoid unnecessary heat gain or heat loss, a towel heater does not reduce its temperature during times of unlikely towel utilization, TVs are not turned off when a person leaves a space, and so on.

FIG. 1 is a diagram of the present system for measuring energy conservation effectiveness. Block 11 may represent an energy conservation (normal) mode of an energy management system for a given room, residential dwelling, or other kind of space or area. In this mode, the energy conservation provisions, such as mechanisms, algorithms, techniques, applications, or the like, of the energy management system may be in effect. Block 12 may represent a reference mode. In this mode, the energy conservation provisions of the energy management system are not in effect. It may be as if the system is operated manually. Energy data may be detected and recorded during the normal mode and the reference mode. The set of data of the reference mode may be compared with the set of data of the normal mode to determine the energy conservation effectiveness of the energy management system.

A duration of data detection and measurement may occur for a $Z_1$ period for the normal mode and a $Z_2$ period for the reference mode. The periods may be about 24 hours or other appropriate duration. Durations may be dependent on a nature of the facility or space being observed. The durations may be long enough for collecting sufficient data for dependable measurements but short enough so as not to disrupt or use extensive time and cost of the use of space for data collection.

From the normal mode at block 11 to the reference mode at block 12, a transition from the normal mode to reference mode may occur at block 13 for a $Y_1$ period of time. The $Y_1$ period of time may be of sufficient duration so that the space or area has stabilized in the reference mode for assurance of obtaining reliable data. An example $Y_1$ period may be about 6 hours or other appropriate duration. Adequate durations for obtaining reliable data may be dependent on a nature of the facility, space or area being observed.

A transition from the reference mode at block 12 to the normal mode at block 11 may occur at block 14 for a $Y_2$ period of time, particularly if a plan is to obtain data at the normal mode. The $Y_2$ period of time may be of sufficient duration so that the space or area has stabilized in the normal mode for assurance of obtaining reliable data. An example $Y_2$ period may be about 6 hours or other appropriate duration. Adequate durations may be dependent on a nature of the facility, space or are observed.

The amount of time used for one cycle of testing including the transition periods may amount to a fraction of the time that the energy management system is not in the normal mode. That fraction may be designated as Psr and the fraction of time that the energy management system is in the normal mode may be designated as PS. Thus, "Ps=1−Psr" as indicated by loop 15. Psr may be indicated by connection 16. An example value for Psr may be 0.02. Generically, the parameter value may be designated as X. Psr may be an indication of how much of the energy savings is sacrificed for a purpose of establishing how much energy is conserved.

Figure 2:
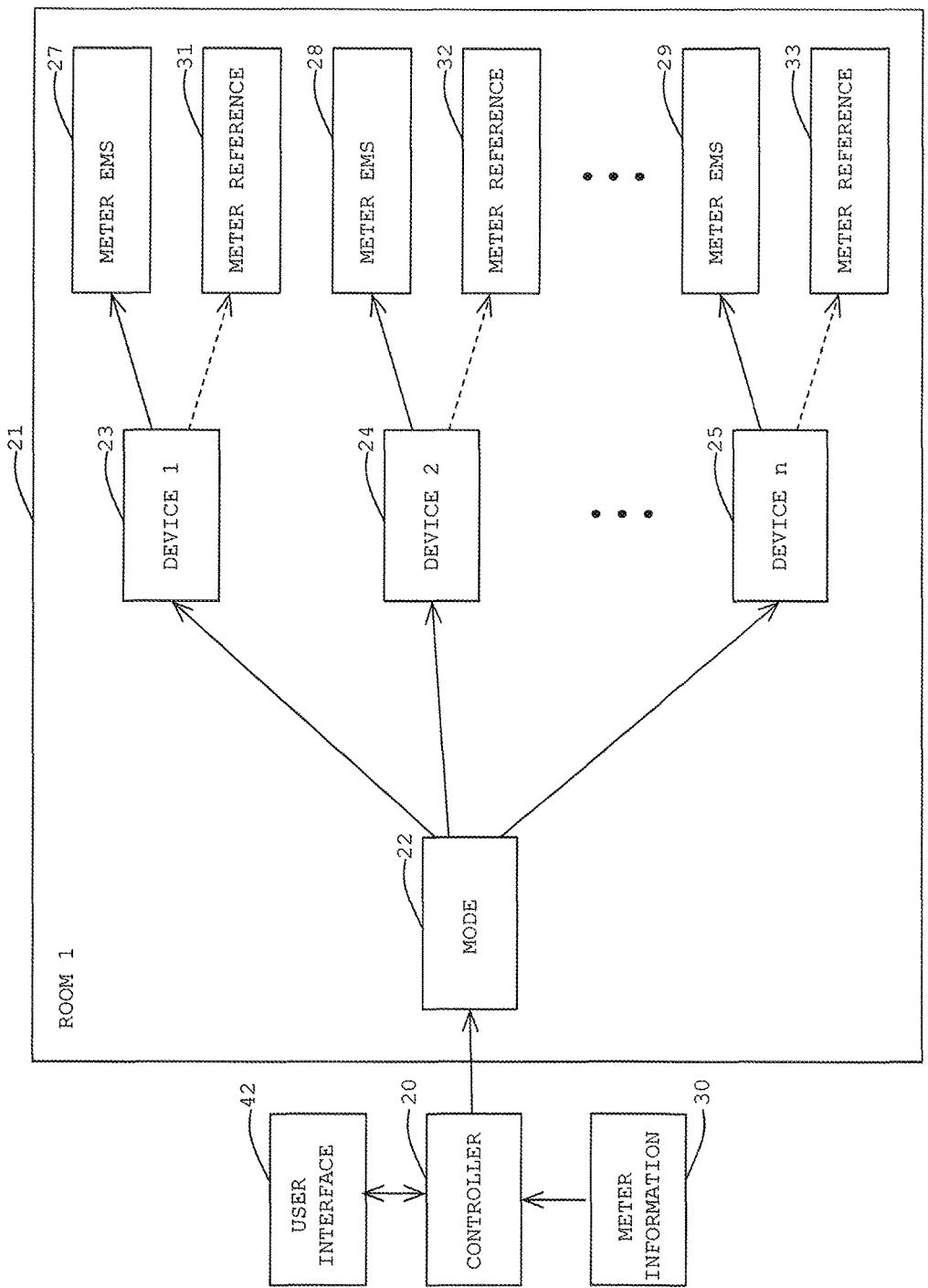
FIG. 2 is a diagram of a space, area or room showing energy consumption devices.

FIG. 2 is a diagram of a space, area or room 21 showing energy consumption devices. A representation of a mode may be indicated by block 22. Devices one and two may be, for example, automated light control and bathroom floor radiant heat. Other energy consumption devices with conservation mechanisms, algorithms, and/or like items, up to a number n, indicated by device n, as represented by block 25 may be in the system. Room 21 may be one space of a multi-space building or facility.

When the mode at block 22 is normal, then the energy of the devices may be measured as managed by the energy management system (EMS). Devices 1 through n are in the normal mode at the same time. Energy of devices 1, 2 and n of blocks 23, 24 and 25 may be individually measured by EMS meters represented by blocks 27, 28 and 29, respectively.

When the mode at block 22 is a reference mode, the energy may be measured of the devices not managed by the energy management system. The devices 1 through n are in the reference mode at the same time. Energy of devices 1, 2 and n of blocks 23, 24 and 25 may be individually measured by reference meters as presented by block 31, 32 and 33, respectively. Devices 1 through n during this mode may operate without use of their energy conservation mechanisms, algorithms, and so forth.

A controller of block 20 may be connected to mode block 22 for mode selection of the devices. Information from meters 27, 28, 29, 31, 32 and 33 as represented by block 30 may go to the controller at block 20. The controller may process meter information, provide calculations of various values for certain parameters such as an index of energy conservation effectiveness and so on, random generator determinations, transition modes, and so forth. A user interface at a block 42 may be connected to the controller for monitoring and inputting information at the controller for a room environmental control system.

FIG. 3 is a diagram of a formula 41 that may be used to determine a percent of savings in energy consumption by a system of elements due to energy conservation techniques, mechanisms and/or algorithms.

FIG. 4 is a diagram of a formula 45 that may be used to determine a percent of savings in energy consumption by an element of a system in a room or space of a multi-space facility.

To recap, a system for determining energy conservation may incorporate two or more elements that consume energy and a meter connected to the two or more elements. The two or more elements may have a normal mode of operation and a reference mode of operation. The normal mode of operation may be when an element operates with an energy conservation mechanism. The reference mode of operation may be when an element operates without an energy conservation mechanism. The meter may measure a first amount of energy consumption by the two or more elements in the normal mode of operation. The meter may measure a second amount of energy consumption by the two or more elements in the reference mode of operation. An amount of effectiveness of energy conservation may be determined from the first and second amounts of energy.

The two or more elements are in the normal mode of operation at the same time. The two or more elements are in the reference mode of operation at the same time.

The first amount of energy consumption may be determined as energy consumption units per unit of time. The second amount of energy consumption may be determined as energy consumption units per unit of time.

The system may further incorporate a configurable random generator for determining when the two or more elements operate in the reference mode of operation.

The elements may have a transitioning mode between the normal mode and the reference mode of operation.

Confidence intervals may be applied to an amount of energy consumption data collected to assure that sufficient data are collected to provide a reliable difference between the elements in the reference mode and the normal mode to demonstrate an amount of effectiveness of energy conservation.

An approach, for measuring effectiveness of energy conservation, may incorporate collecting energy consumption data on two or more elements that control energy in an observed space, synchronizing the two or more elements so as to enter and exit a reference mode and a normal mode, respectively, at the same time, and that the elements are in the same mode for the same duration, and comparing energy consumption data on the two or more elements in the normal mode and the reference mode to determine an index of energy consumption effectiveness.

In the reference mode, the two or more elements may be operated without their respective energy conservation algorithms engaged. In the normal mode, the two or more elements may be operated with their respective energy conservation algorithms engaged.

The two or more elements may have a transition period between the reference mode and the normal mode.

Durations of the reference mode, the transition period and the normal mode, and/or a rate of the reference and normal modes may be determined by a configurable random generator.

A randomization process may be implemented to determine when the two or more elements are in the reference mode and the normal mode.

Confidence intervals may be applied to the energy consumption data collected to assure that sufficient data are collected to provide a reliable difference between the elements in the reference mode and the normal mode to demonstrate the effectiveness of the energy conservation algorithms.

The elements may incorporate two or more items selected from a group consisting of drapery control, lighting control, radiant floor heating control, towel heating control, television control, ventilation control, heat control, and air conditioning control.

An energy conservation measurement mechanism may incorporate a controller and two or more energy consuming devices connected to the controller. Each energy consuming device may have an energy conservation application that can be engaged or disengaged, in place or not in place, or active or inactive. The controller may take a first measurement of energy usage by the two or more energy consuming devices when their conservation applications are engaged. The controller may take a second measurement of energy usage by the two or more consuming devices when their conservation applications are disengaged. The controller may determine a difference of energy usage between the first and second measurements.

An index of energy conservation effectiveness may be determined from the difference of energy usages of the first and second measurements.

P percent of energy saving potential may be sacrificed for establishing the index of energy conservation effectiveness. P percent may equal a period of time sacrificed for establishing the index of energy conservation effectiveness divided by a period of time energy saving potential not sacrificed for establishing the index of energy conservation effectiveness.

The two or more energy consuming devices may have their conservation applications engaged at the same time. The two or more energy consuming devices may have their conservation applications disengaged at the same time.

A transition time may be a period of time between the first measurement of energy usage by the two or more energy consuming devices when their conservation applications are engaged and the second measurement of energy usage by the two or more energy consuming devices when their conservation applications are disengaged.

Each room of a multi-room facility having N rooms may randomly turn off its conservation application for a pre-determined period of time. N multiplied by the pre-determined period of time may be an amount of time of the multi-room facility for energy usage by the energy consuming devices when their conservation applications are disengaged for determining an index of energy conservation effectiveness. A turning off the conservation applications of the devices for a room may randomly occur at any time.

The two or more energy consumption devices may be situated in each room of a multi-room facility, an index of energy conservation effectiveness may be determined for each room, or an index of energy conservation effectiveness may be determined for the multi-room facility.

The controller may obtain a measurement of energy usage by each of the two or more energy consuming devices by tracking a run-time of each device and multiplying the run-time of each device by a wattage or equivalent parameter of each respective device.

An index of energy conservation effectiveness may be determined for at least one device of the two or more energy consuming devices from a difference of energy usages between a first measurement of energy usage of the at least one device when its conservation application is engaged and a second measurement of energy usage of the at least one device when its conservation application is disengaged.

The controller may take the first measurement of the at least one device by recording a run-time of the at least one device, multiplied by a wattage or equivalent parameter of the at least one device, when its conservation application is engaged. The controller may take the second measurement of the at least one device by recording a run-time of the at least one device, multiplied by a wattage or equivalent parameter of the at least one device, when its conservation application is disengaged.

In the present specification, some of the matter may be of a hypothetical or prophetic nature although stated in another manner or tense.

Although the present system and/or approach has been described with respect to at least one illustrative example, many variations and modifications will become apparent to those skilled in the art upon reading the specification. It is therefore the intention that the appended claims be interpreted as broadly as possible in view of the related art to include all such variations and modifications.

What is claimed is:

1. A system for determining energy conservation in a multi-room building comprising:
    a first room of the multi-room building comprising:
        two or more devices that consume energy, the two or more devices situated within the first room of the building; and
        a first meter connected to each of the two or more devices; and
    a second room of the multi-room building comprising:
        two or more devices that consume energy, the two or more devices situated within the second room of the building; and
        a second meter connected to each of the two or more devices; and
    wherein:
    the two or more devices of the first room and the two or more devices of the second room have a normal mode of operation and a reference mode of operation;
    the normal mode of operation is when a device operates with an energy conservation mechanism;
    the reference mode of operation is when a device operates without an energy conservation mechanism;
    the first and second meters connected to each of the devices measures a first amount of energy consumption by the two or more devices of each of the first and second rooms in the normal mode of operation;
    the first and second meters connected to each of the devices measures a second amount of energy consumption by the two or more devices in the reference mode of operation;
    an amount of effectiveness of energy conservation is determined from the first and second amounts of energy using a mathematical formula;
    the two or more devices of the first room are in the normal mode of operation at the same time;
    the two or more devices of the first room are in the reference mode of operation at the same time;
    the two or more devices of the second room are in the normal mode of operation at the same time;
    the two or more devices of the second room are in the reference mode of operation at the same time; and
    the mode of operation of the first or second rooms is selected randomly by a configurable random generator.

2. The system of claim 1, wherein:
    the first amount of energy consumption is determined as energy consumption units per unit of time; and
    the second amount of energy consumption is determined as energy consumption units per unit of time.

3. The system of claim 1, wherein the devices have a transitioning mode between the normal mode and the reference mode of operation.

4. A method, for measuring effectiveness of energy conservation, comprising:
    collecting energy consumption data on two or more devices that control energy in a first single observed space within a building;
    synchronizing the two or more devices in the first single observed space so as to enter and exit a reference mode and a normal mode, respectively, at the same time, and that the devices are in the same mode for the same duration;
    collecting energy consumption data on two or more devices that control energy in a second single observed space within the building;
    synchronizing the two or more devices in the second single observed space so as to enter and exit a reference mode and a normal mode, respectively, at the same time, and that the devices are in the same mode for the same duration;
    comparing energy consumption data on the two or more devices in the first single observed space and the two or more devices in the second single observed space in the normal mode and the reference mode to determine a percent of energy savings in energy consumption; and
    wherein:
    in the reference mode, the two or more devices in the first single observed space and the two or more devices in the second single observed space are operated without their respective energy conservation algorithms engaged;
    in the normal mode, the two or more devices in the first single observed space and the two or more devices in the second single observed space are operated with their respective energy conservation algorithms engaged; and
    the first single observed space and the second single observed space are operated in the reference mode or the normal mode independently of one another.

5. The method of claim 4, wherein the two or more devices in the first single observed space and the two or more devices in the second single observed space have a transition period between the reference mode and the normal mode.

6. The method of claim 5, wherein durations of the reference mode, the transition period and the normal mode are determined by a configurable random generator.

7. The method of claim 4, wherein a randomization process is implemented to determine when the two or more devices in the first single observed space and the two or more devices in the second single observed space are in the reference mode and the normal mode.

8. The method of claim 4, wherein the devices comprise two or more items selected from a group consisting of drapery control, lighting control, radiant floor heating control, towel heating control, television control, ventilation control, heat control, and air conditioning control.

9. An energy conservation measurement mechanism comprising:
a controller; and
two or more energy consuming devices in each room of a multi-room facility having N rooms and connected to the controller; and
wherein:
each energy consuming device has an energy conservation application that can be engaged or disengaged;
each room of a multi-room facility having N rooms randomly turns off its conservation application for a pre-determined period of time in response to a command from the controller;
a turning off the conservation applications of the devices for a room can randomly occur at any time as determined by a configurable random generator;
the controller takes a first measurement of energy usage by the two or more energy consuming devices in a first room and the two or more energy consuming devices in a second room when their conservation applications are engaged;
the controller takes a second measurement of energy usage by the two or more consuming devices when their conservation applications are disengaged; and
the controller determines a difference of energy usage between the first and second measurements; and
the controller is configured to wait a predetermined length of time from an end of when the conservation applications are engaged to taking the second measurement when conservation applications are disengaged.

10. The mechanism of claim 9, wherein a percentage of energy savings is determined from the difference of energy usages of the first and second measurements.

11. The mechanism of claim 10, wherein:
a percent of energy saving potential is sacrificed for establishing the percentage of energy savings; and
the percent of energy saving potential equals a period of time sacrificed for establishing the percentage of energy savings divided by a period of time energy saving potential not sacrificed for establishing the percentage of energy savings.

12. The mechanism of claim 9, wherein:
the two or more energy consuming devices in the first room and the two or more energy consuming devices in the second room have their conservation applications engaged at the same time; and
the two or more energy consuming devices in the first room and the two or more energy consuming devices in the second room have their conservation applications disengaged at the same time.

13. The mechanism of claim 12, wherein a transition time is a period of time between the first measurement of energy usage by the two or more energy consuming devices when their conservation applications are engaged and the second measurement of energy usage by the two or more energy consuming devices when their conservation applications are disengaged.

14. The mechanism of claim 10, wherein:
N multiplied by the pre-determined period of time is an amount of time of the multi-room facility for energy usage by the energy consuming devices when their conservation applications are disengaged for determining an index of energy conservation effectiveness.

15. The mechanism of claim 10, wherein:
a percentage of energy savings is determined for each room; or
a percentage of energy savings is determined for the multi-room facility.

16. The mechanism of claim 9, wherein the controller obtains a measurement of energy usage by each of the two or more energy consuming devices by tracking a run-time of each device and multiplying the run-time of each device by a wattage or equivalent parameter of each respective device.

17. The mechanism of claim 10, wherein:
a percentage of energy savings is determined for at least one device of the two or more energy consuming devices from a difference of energy usages between a first measurement of energy usage of the at least one device when its conservation application is engaged and a second measurement of energy usage of the at least one device when its conservation application is disengaged;
the controller takes the first measurement of the at least one device by recording a run-time of the at least one device, multiplied by a wattage or equivalent parameter of the at least one device, when its conservation application is engaged; and
the controller takes the second measurement of the at least one device by recording a run-time of the at least one device, multiplied by a wattage or equivalent parameter of the at least one device, when its conservation application is disengaged.

* * * * *